United States Patent [19]
Salik et al.

[11] Patent Number: 5,916,711
[45] Date of Patent: Jun. 29, 1999

[54] PHASE-SHIFTING MASKS FOR PHOTOLITHOGRAPHY

[75] Inventors: Boaz Salik, New York, N.Y.; Amnon Yariv, San Marino, Calif.

[73] Assignee: California Institute of Technology, Pasadena, Calif.

[21] Appl. No.: 08/947,475

[22] Filed: Oct. 10, 1997

[51] Int. Cl.[6] ...................................................... G03F 9/00
[52] U.S. Cl. ...................................................................... 430/5
[58] Field of Search ........................ 430/5, 322; 364/488

[56] References Cited

U.S. PATENT DOCUMENTS

| | | | |
|---|---|---|---|
| 5,288,568 | 2/1994 | Cathey, Jr. | 430/5 |
| 5,429,897 | 7/1995 | Yoshioka et al. | 430/5 |
| 5,468,578 | 11/1995 | Rolfson | 430/5 |
| 5,480,747 | 1/1996 | Vasudev | 430/5 |
| 5,538,815 | 7/1996 | Oi et al. | 430/5 |
| 5,686,208 | 11/1997 | Le et al. | 430/5 |

*Primary Examiner*—S. Rosasco
*Attorney, Agent, or Firm*—Fish & Richardson P.C.

[57] ABSTRACT

A method of designing phase shifting masks with improved resolution. Auxiliary transmissive phase regions with properly selected locations and dimensions are introduced to eliminate unwanted interference patterns. A usual opaque region between the transmissive features that are phase-conflicting to one another is partially or entirely replaced with a transmissive region of an opposite phase with respect to the phase of the transmissive features. In positive photoresist layouts, the light-absorbing features are partially or entirely made transmissive while an opposite and uniform phase is maintained throughout the transmissive background. Segmenting features with at least one auxiliary phase region and adjusting attenuation of different features can further improve the performance.

26 Claims, 12 Drawing Sheets

PHASE-SHIFTING MASKS FOR PHOTOLITHOGRAPHY

FIELD OF THE INVENTION

The present invention relates to photoresist masks in photolithography. More particularly, the present disclosure describes techniques for designing phase-shifting masks to substantially reduce adverse interference patterns.

BACKGROUND OF THE INVENTION

Photolithography is a widely used technique for forming a desired image pattern on a substrate using light or other electromagnetic radiation. One example is the formation of integrated circuits on a semiconductor substrate. A mask imprinted with the desired pattern is used as a template for shielding the radiation according to the pattern during a photoexposure.

Two types of masks are commonly used in photolithography. One is an amplitude mask in which an image pattern is simply imprinted as opaque and transmissive features. The transmissive features have the same phase delay relative to one another. An amplitude mask can be relatively easy to manufacture but is usually limited in feature resolution and contrast.

Phase masks are another commonly used mask type in photolithography and are known for their capabilities of improving both resolution and focal depth relative to amplitude masks. Unlike amplitude masks, the features of an imprinted image pattern on a phase mask are assigned with different relative phase delays. A conventional phase mask usually operates based on the destructive interference between adjacent features with opposite phases after imaging by a finite aperture. Conventional phase masks were first proposed by Levenson et al. in IEEE Trans. Electron. Devices, Vol.29, pp. 1828, 1982 and are often referred to as "Levenson-type" phase masks.

Figure 1A:
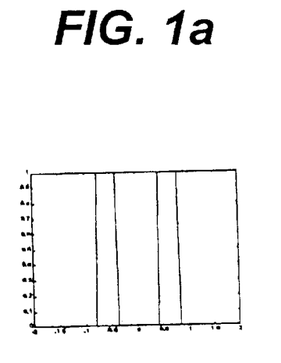
FIG. 1a is a schematic diagram of a one-dimensional amplitude mask having two slits.
Figure 1B:
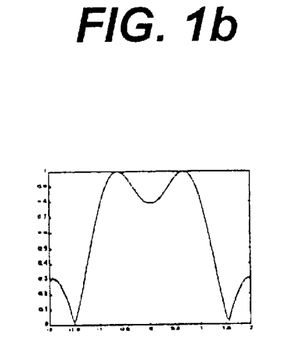

FIG. 1a shows an amplitude mask with a simple one-dimensional two-slit pattern. Slits 110 and 120 are transmissive and the rest of the mask is opaque. The amplitude of the optical field after imaging the pattern with a finite aperture is shown in FIG. 1b. The resultant field between the two slits 110 and 120 is relatively large compared to the field transmitted through either slit and hence it can be said that the two slits are not well resolved.

Figure 2A:
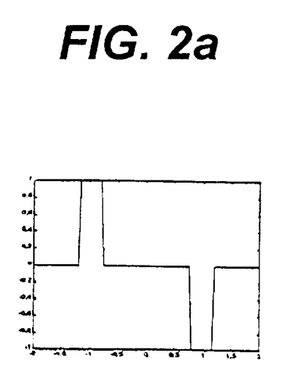
FIG. 2a is a chart showing the phase distribution of a one-dimensional phase mask having two slits with opposite phase values.
Figure 2B:
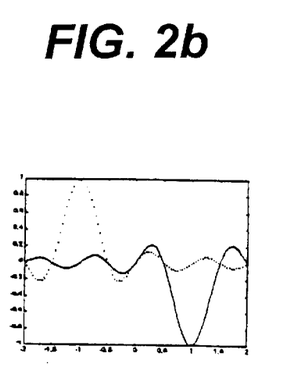
Figure 2C:
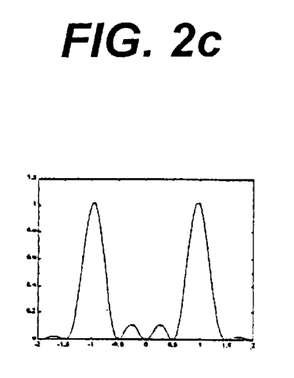

Phase masks can be used in such a situation to improve the resolution using the same aperture and illumination for imaging. FIG. 2a shows a phase distribution along the x-axis of a conventional Levenson-type phase mask having two slits. The phase values of the two slit features are shifted by $\pi$ radians relative to each other. This leads to a destructive interference between the optical fields from the two slits in imaging and the two slits are hence better resolved. The resultant distribution of the field amplitude is shown in FIG. 2b. FIG. 2c further shows the corresponding intensity distribution in the imaging field and indicates a significant improvement in both resolution and contrast over the amplitude mask shown in FIGS. 1a and 1b.

Figure 3A:
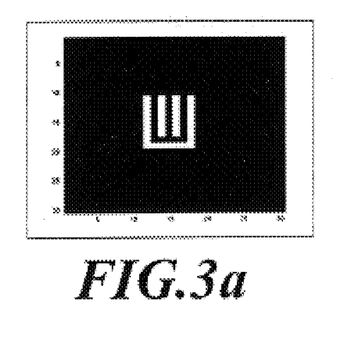
FIGS. 3a–3d illustrate the effect of phase conflict on a two-dimensional image formed on a negative photoresist. The grey area in FIG. 3b indicates a π-phase shift relative to the white areas.

One-dimensional images, such as the simple mask in FIG. 2a, can be assigned a phase layout with an opposite phase shift between two adjacent features. This, however, is not necessarily true for two-dimensional images. FIG. 3a illustrates an amplitude mask designed for a negative photoresist having a two-dimensional pattern with three transmissive features in opaque background. Each feature is located adjacent to the other two. If two adjacent features are assigned an opposite phase with respect to each other, two of the three neighboring features will have the same phase.

Figure 3B:
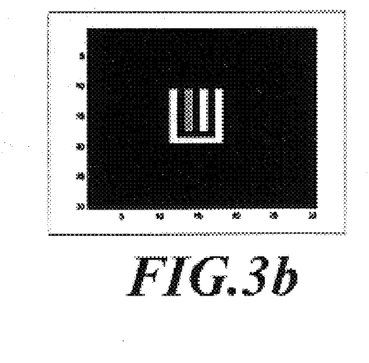
Figure 3C:
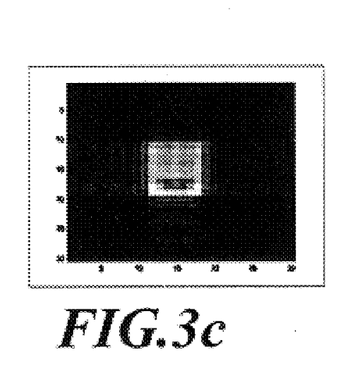
Figure 3D:
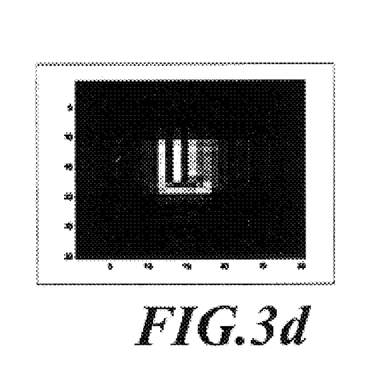

FIG. 3b shows such an example in which the grey feature is $\pi$-phase shifted with respect to the other two features of the same phase. The amplitude mask of FIG. 3a suffers a severe distortion after imaging as shown in FIG. 3c. In addition, the phase mask shown in FIG. 3b cannot resolve the two features of the same phase after imaging with the same aperture and illumination (FIG. 3d). This effect is intrinsic to images of two or more dimensions in negative photoresist and is usually referred as "phase conflict". When the two adjacent features with the same phase have a phase conflict with each other, the fields from the two features constructively interfere with each other to produce a field maximum. Such undesirable interference often causes several features to merge with one another, making the images unresolvable.

Another known adverse effect associated with phase masks is spurious line formation formed by two dimensional positive photoresist masks which have transmissive background and opaque features. Conventional phase masks usually need to have transmissive features (i.e., negative photoresists) so that opposite phase values can be assigned to two adjacent features. For positive photoresists, there are no independent transmissive features which can receive the assignment of an opposite phase. One example is shown by a simple two-dimensional pattern in FIG. 4a. A mask 400 has an opaque rectangular feature 410 in the center of a transmissive background 420.

One prior-art method of forming phase masks on positive photoresisits suggests segmenting the transmissive background into different regions and applying opposite phases to adjacent regions in the background. This, however, produces undesired spurious lines at the boundaries of these features, thus resulting in adverse split of a feature. FIGS. 4b and 4c show an example of segmenting the background in the mask 400 of FIG. 4a and the resultant line formation after imaging, respectively. In FIG. 4b, the left-hand half 422 and the right-hand half 424 of the transmissive background 420 are assigned with phase delays having a phase difference of $\pi$. This phase segmentation causes adverse line formation in the imaging field as shown by FIG. 4c.

Both the phase conflict in negative photoresists and line formation in positive photoresist are well recognized in the field of photolithography. Many attempts have been made to design phase masks to substantially reduce or minimize these adverse effects.

One conventional method of designing phase masks uses a pixel-by-pixel approach. This is disclosed by Liu et al. in SPIE vol. 1674, pp.14 (1992), IEEE Trans. Semiconduct. Manuf. vol.5, pp. 138 (1992) and vol.9, pp.170 (1996). This method entails finding an optimal amplitude and phase distribution over the mask using an optimization algorithm. This approach has several limitations. One limitation is the large amount of processing power that is required. The imaged pattern must be calculated for each mask variation, and these variations must be scanned over all the pixels. Therefore, the pixel-wise optimization time scales with the number of pixels to the third power (or more). Industrial masks usually have sizes of at least $10^4 \times 10^4 = 10^8$ pixels. Thus, the computation times of this method can become prohibitive. Although this method has been improved to have an optimization time scaling with the number of pixels squared by using a modified algorithm which saves the scanning over pixels, it is still prohibitive for industrial-scale masks. Another limitation with this approach is that at least four levels of phase delays are usually needed for the method to be effective. This is unappealing due to the difficulty of manufacturing four-phase-level masks.

Another prior-art method in designing phase masks was disclosed by Watanabe et al. in JJAP I/12B vol.33, pp.6790 (1994). This is a multiple-exposure approach to solving the phase conflict. The method is inherently unattractive to industrial manufacturers because it takes twice the photolithography time as compared with single-exposure techniques. Another limitation of this technique is the substantial alignment and mechanical errors that often occur between the two exposures.

Pati and Kailath described a rule-based approach based on superposition of subsolutions in Journal of Optical Society of America, vol. A11, pp.2438, 1994. This method has an optimization time that scales quadratically with the number of pixels. However, the improvement introduced is in the computation time for the imaged pattern, and entails an approximation of partially coherent imaging by a fully coherent system. This is accurate only for near-fully coherent imaging due to its reliance on the linearity of field superpositions. Since many industrial lithography systems currently use either partially-coherent or fully-incoherent illumination, this approach is not widely applicable. Furthermore, the actual optimization of this method is a Gerschberg-Saxton type algorithm, which is fast but tends to settle on highly suboptimal minima. This sacrifices phase mask performance for computational speed. Finally, this approach also requires either four phase levels per mask or two-mask imaging, both of which are problematic to manufacture.

One prior-art method of adapting phase masks to positive photoresists was disclosed by Yuan et al. in JJAP I(12B) vol.33, pp. 6796 (1994). However, this method can be applied only to limited and simple cases, e.g., contact holes. In addition, this method is intended for specific phase mask technologies such as attenuated phase masks and may not work for other type of phase masks.

Cathey et al. disclosed a method for minimizing the line formation of positive-photoresist masks in U.S. Pat. Nos. 5,281,500 and 5,288,568. This method uses a "tapered" phase transition area between one phase-shifted region and an adjacent non-phase-shifted region rather than an abrupt step-like phase change shown in FIG. 4b. One disadvantage of the approach is the extreme difficulty in manufacturing a tapered mask. Another disadvantage is the need for a relatively large area to implement such tapered transition regions. This can compromise feature density and the resolution may be reduced.

Use of phase-shifting regions in negative photoresist to reduce the effect of phase conflict was described in U.S. Pat. No. 5,468,578 to Rolfson. This method uses the entire opaque region between the phase-conflicting transmissive features to become a phase-shifting transmissive region. This can lead to large negative fields printed on the photoresist, resulting in a degraded image resolution. In addition, this method only treats phase conflict between two non-phase-shifting regions. This is limiting since phase conflict also arises between adjacent phase-shifting regions. Furthermore, the computation time of this method scales quadratically with the number of pixels, which becomes impractical in designing large-scale masks for industrial use.

SUMMARY OF THE INVENTION

In recognition of the above, the inventors of the present invention disclose phase mask techniques which improve the resolution and contrast of the images on the wafer-plane.

According to one embodiment of the invention, auxiliary transmissive phase regions are introduced in both positive and negative phototresists to improve the resolution and substantially reduce unwanted interference patterns. The auxiliary transmissive phase regions are configured to have predetermined geometry and dimension and are disposed at properly selected locations. In negative photoresists, an opaque region between phase-conflicting transmissive features may be replaced at least partially with a transmissive region of an opposite phase with respect to the phase of the transmissive features. In positive photoresists, light-absorbing features embedded in a transmissive background may be made transmissive and phase-shifted relative to the phase of the background to reduce the adverse interference.

One aspect of the invention is the use of auxiliary transmissive phase regions in areas of a phase mask that are originally opaque. The insertion locations, dimension, and phase values for the inserted phase regions are properly chosen to effectively reduce adverse interference patterns.

Another aspect of the invention is segmentation of one or more continuous phase features into a plurality of alternating segments with opposite phase values.

In addition, the attenuation of selected phase regions may be adjusted to further improve the resolution.

One of the advantages of the invention is to overcome the phase conflict problem in negative photoresists and substantially reduce or minimize the line formation associated with positive photoresists.

Another advantage is to optimize the amplitude and phase distribution in designing phase masks with fast optimization time. The design process is a heuristic optimization technique that has a computation time with a linear dependence on the mask size.

A further advantage is the general applicability of the methods in accordance with the present invention. The methods of using auxiliary phase regions can be applied to all phase mask techniques with increased design flexibility and may also be used beneficially in non-phase-mask techniques. In particular, the techniques of the invention are compatible with masks made of widely-used positive photoresists.

BRIEF DESCRIPTION OF THE DRAWINGS

These and other advantages of the present invention will become more apparent in light of the following detailed description of exemplary embodiments thereof, as illustrated in the accompanying drawings, in which:

FIG. 1b is a chart showing a simulated amplitude distribution of the imaged field using the mask of FIG. 1a.

FIGS. 2b and 2c are respectively charts of the simulated amplitude and intensity distributions of the imaged field of a phase mask of FIG. 2a.

DETAILED DESCRIPTION OF THE PREFERRED EMBODIMENTS

Figure 10A:
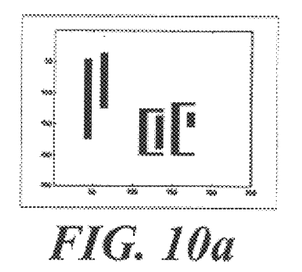
FIGS. 10a–10f compare output images of an amplitude mask, a Levenson-type phase mask and a phase mask in accordance with the present invention for positive photoresist by a simulation. The grey areas in FIGS. 10c and 10e indicate phase areas that are π-phase shifted relative to the white areas.
Figure 10B:
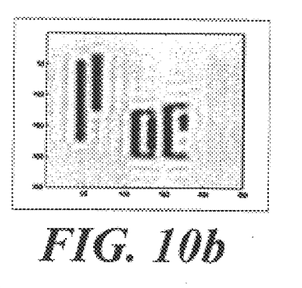
Figure 10C:
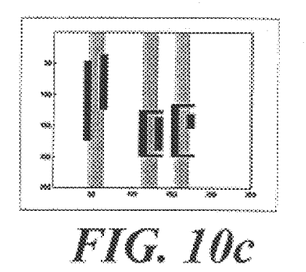

In this specification, a "feature" is used to indicate a continuously connected region in a mask. For example, in FIG. 3a, the region 302 is a feature and the region 304 is another feature. In particular, the opaque background 306 is also considered as an individual feature since it is a continuously connected region. For another example, in FIG. 10a, the opaque regions 802 and 804 are two different features while the transmissive background 806 is also a feature. It should be noted that, however, the term "background" is frequently used herein for consistency with descriptions in many publications on the subject and for clarity, and should be construed as a feature in accordance with the above definition.

One embodiment of the invention introduces a plurality of auxiliary transmissive phase regions or features in properly selected locations. This at least in part improves the image resolution on the wafer plane and reduces unwanted interference patterns. The phase and location of each inserted transmissive phase region or feature are chosen to substantially increase the image resolution and quality. Attenuation of a transmissive phase region may be adjusted to further improve the performance of the phase mask and to add design flexibility.

The performance of a mask can be characterized by the field distribution of an image of the mask using a finite imaging aperture. For a one-dimensional mask, an aberration-free imaging system under the Fresnel approximation can be described by the Fourier transform of the image and the pupil function of the aperture. This is described by J. W. Goodman in Introduction to Fourier Optics, page 88, McGraw-Hill, New York, 1988. The Fourier transform of the output field can be expressed as $$F[E_o(x)] = F[E_i(x)]P(x/\lambda f), \tag{1}$$

where x is the spatial coordinate, $E_i(x)$ is the pattern (field) produced by the mask and to be imaged onto a wafer plane, $E_o(x)$ is the output field on the wafer plane, P is the pupil function which has a form of $(\sin x)/x$ if no aberrations are present, and F denotes a Fourier-transforming operation. Equation (1) can be expressed as the following convolution in the spatial domain:

$$E_o(x) = E_i(x) * F^{-1}[P(x/\lambda f)], \tag{2}$$

wherein * represents the operation of convolution. For partially coherent illumination, the intensity distribution of the output field can be represented by the Hopkins formula:

$$|E_o(X')|^2 = \int\int E_i(x) E_i^*(\bar{x}) J(x,\bar{x}) K(x,\bar{x}) K^*(\bar{x}, x') dx d\bar{x}, \tag{3}$$

where K is the impulse response of F[P] and J is the mutual intensity function. See, J. W. Goodman, in Statistical Optics, page 308, Wiley & Sons, New York (1985). Imaging of two-dimensional masks can also be represented by a Hopkins formula in two dimensions that is similar to Equation (3). Therefore, the field generated by any mask including a phase mask for a given imaging system may be calculated using the above Hopkins formula. In particular, the effect of an auxiliary phase feature on the field distribution produced by a mask on the wafer plane can be computed.

For convenience, a look-up table may be used as an alternative to the direct computation of the field distribution on the wafer plane for a set of predetermined auxiliary phase features. A look-up table may have the intensity distributions of the imaged fields $E_o(x)$ on the wafer plane for one or more pre-specified auxiliary phase features for the mask pattern $E_i(x)$. For each auxiliary phase feature, its effect on the wafer-plane field distribution is calculated using the appropriate Hopkins formula for a given imaging system. The results are stored in the look-up table for future use. Results of the same auxiliary feature under various imaging systems may also be stored in the look-up table. In effect, the look-up table is a database having results for various auxiliary phase features under one or more imaging systems based on the Hopkins formula.

Preferably, the pre-specified phase features for a look-up table have dimensions that are close to the size of the minimum mask-plane features to achieve flexibility. A minimum mask-plane feature size is usually determined by a specific mask manufacturing process, typically being an e-beam lithography.

The size of such a look-up table can be reduced since the auxiliary phase features of interest are usually small in many practical applications. The interesting features are typically less than 10 pixels wide and thus a set of allowable mask patterns $E_i(x)$ within the regions defined by the features is often limited.

Figure 5:
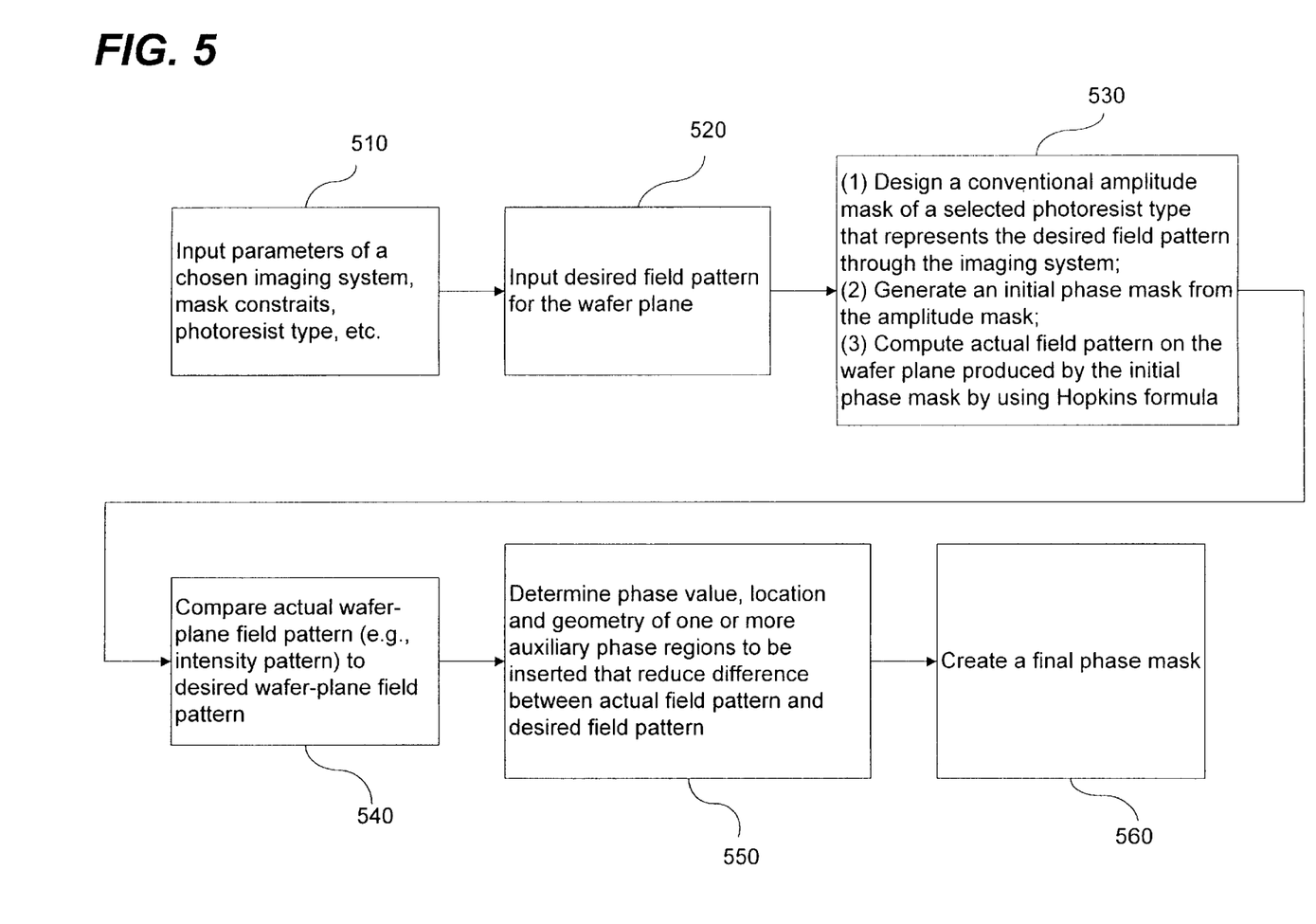
FIG. 5 is a flowchart showing one embodiment of the design method in accordance with the invention.

One embodiment of the design methodology of the invention is shown in a flowchart in FIG. 5. In step 510, design parameters of a phase mask are determined. For example, the parameters of a chosen imaging system, such as aperture size, degree of coherence, demagnification factor, aberration factors, etc. are determined; mask constraints e.g., minimum mask feature size, are also determined; furthermore, photoresist type (i.e., positive or negative) and contrast are determined.

At step 520, a desired wafer-plane field pattern is determined. The pattern may be a circuit layout or other desired patterns.

Next at step 530, a design for a conventional amplitude mask for a desired wafer-plane field is first created based on the photoresist type. For negative photoresist, the background is opaque and the pattern features are transmissive. For positive photoresists, the background is transmissive and the pattern features are opaque. Then, a design of an initial phase mask is produced based on the amplitude mask. For example, a negative-photoresist amplitude mask can be converted into a Levenson-type phase mask by assigning adjacent transmissive features with opposite phase values. A positive-photoresist amplitude mask can be converted into a phase mask by making the opaque features transmissive. The background is then assigned with a uniform phase value and the transmissive features are then assigned with a common phase value opposite to the phase value of the background. However formed, the actual wafer-plane field distribution of the initial phase mask is then calculated by using the Hopkins formula.

At step 540, the calculated actual field pattern of the initial phase mask and the desired field pattern is compared to determine a difference therebetween.

Based on this difference, the location, geometry, and phase value of one or more auxiliary phase regions or features are determined by using the Hopkins formula to substantially reduce the difference. This is shown as step 550 in the flowchart in FIG. 5.

More specifically, in areas where the actual intensity exceeds the desired intensity (typically a negative photoresist problem caused by phase conflict), auxiliary regions of phase opposite to the phase of the field in those regions can be inserted; in areas where the actual intensity is lower than the desired intensity (typically a positive photoresist problem), auxiliary regions of phase equal to the phase of the field in those regions can be inserted.

The geometry, i.e., the size and shape, of each auxiliary region can be determined with different methods. One method uses a look-up table to choose one or more pre-specified auxiliary features that would produce a field distribution closest to the desired field pattern.

Another method uses an iterative optimization approach based on the Hopkins formula. Initial size and shape for each auxiliary region are determined by either guessing or any other suitable method. The initial choice of the geometry of the auxiliary features are not critical but can affect the design time. For example, at least one auxiliary phase region with an opposite phase may be added at every mask-plane point where the wafer-plane intensity is higher than the desired intensity; and conversely the same-phase auxiliary region may be added at every mask-plane point where the wafer-plane intensity is lower than the desired intensity. Addition of auxiliary phase regions results in a revised design of the initial phase mask.

Next, the new wafer-plane field due to the revised phase mask is computed using the Hopkins formula and the result is compared to the desired wafer-plane intensity.

If the difference between the desired field pattern and the actual field pattern is within a predetermined tolerance threshold, the design of the phase mask is completed. Otherwise, previously inserted auxiliary phase regions will be altered again or new auxiliary phase regions will be added to reduce any resolvable error that exists at the wafer plane.

At step 560, the design of the phase mask is finalized and an actual phase mask is produced.

Figure 6A:
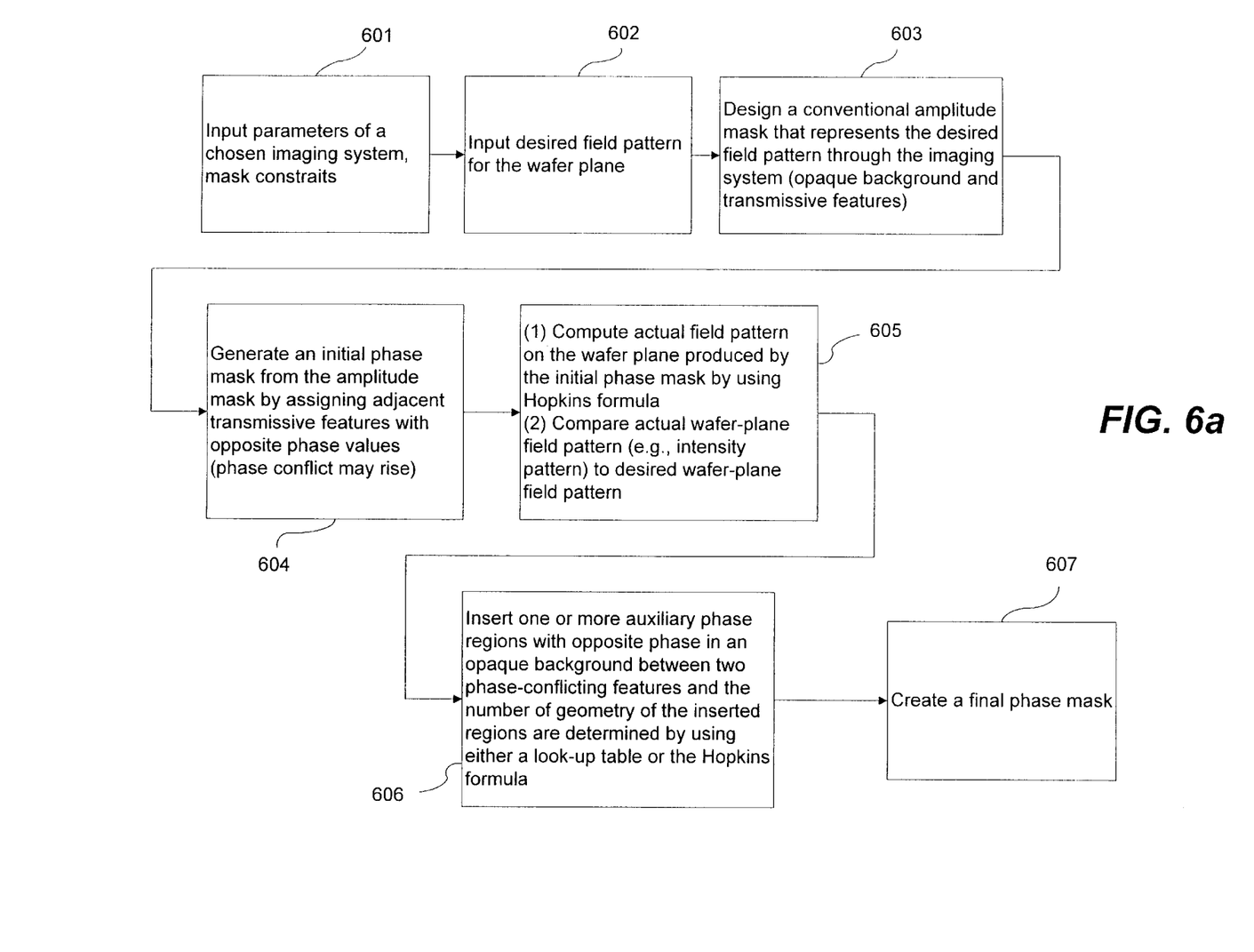
FIG. 6a is a flowchart showing one method for designing a phase mask for negative photoresists in accordance with the method of FIG. 5.
Figure 6B:
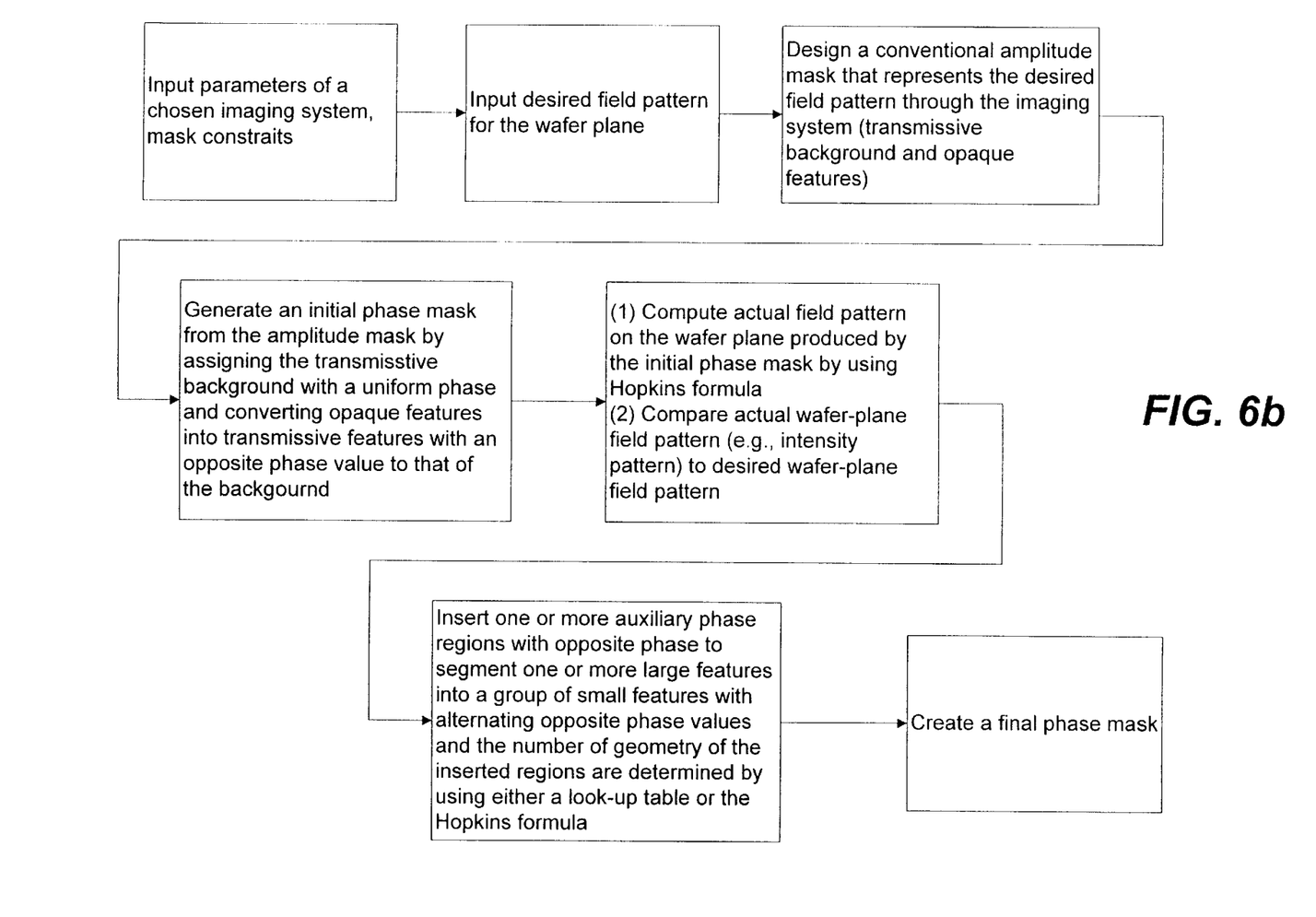
FIG. 6b is a flowchart showing one method for designing a phase mask for positive photoresists in accordance with the method of FIG. 5.

The above design method for phase masks is applicable to both positive and negative photoresists. However, the detailed implementation of the method in designing phase masks based on these two types of photoresists can be different. FIGS. 6a and 6b respectively show two embodiments for designing negative and positive photoresists based on the method shown in FIG. 5.

FIG. 6a shows one method of designing a two-dimensional phase mask with negative photoresist. A negative-photoresist amplitude mask indicative of the desired pattern is first converted to a phase mask with the conventional method, i.e., assigning two adjacent transmissive features with opposite phases (steps 601–604). At step 605, the difference between the field by the initial phase mask and the desired field pattern is determined. At step 606, an opaque background region between the transmissive features that are phase-conflicting to one another is preferably replaced with at least one auxiliary transmissive phase region having a phase opposite to the phase of the phase conflicting features. The auxiliary phase region preferably has a uniform phase that is opposite to the phase of the adjacent conflicting features. A plurality of such auxiliary phase regions may be inserted in the opaque region to further minimize the undesired fields due to interference. The Hopkins formula or the corresponding look-up table can be used to determine the number of the multiple auxiliary phase regions and the duty cycles that are needed to achieve the minimum interference. At step 607, the final phase mask is generated.

FIG. 6b shows a method for designing a two-dimensional phase mask with positive photoresist. A conventional amplitude mask for a desired wafer-plane pattern is first converted into an initial phase mask. The opaque features are made transmissive and are assigned to have a phase opposite to the phase of the transmissive background that is maintained with a uniform phase. For features of large opaque areas, segmenting of each feature into a plurality of opposite-phase regions may be performed to avoid large negative fields. Implementation of such segmenting is carried out based on the field distribution from the Hopkins formula or the corresponding look-up table.

Therefore, an optimal design is achieved in a heuristic manner in accordance with the present invention. The computation time is derived theoretically from the fact that each pixel in the mask may be processed only twice: once to assign phase and identify features and once to insert auxiliary phase features. The design method does not require calculation of the fields by using the imaging equation because the phase assignment is heuristic. Therefore, the computation time increases linearly with the mask size.

Figure 7A:
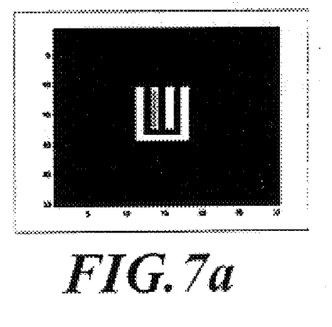
FIGS. 7a–7f show a comparison of the output images of a conventional Levenson-type phase mask exhibiting phase conflict and a phase mask manufactured according to the present invention. The grey areas in FIGS. 7a and 7b indicate phase areas that are π-phase shifted relative to the white areas.
Figure 7B:
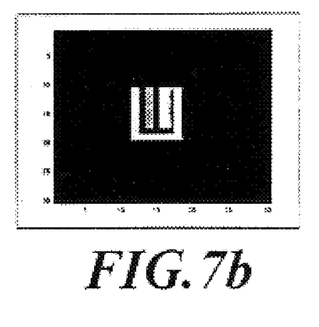
Figure 7C:
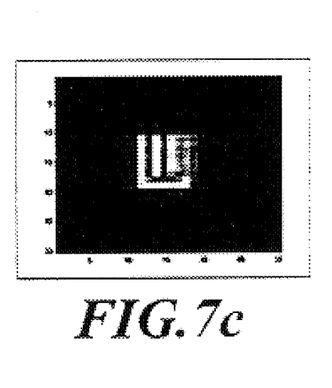
Figure 7D:
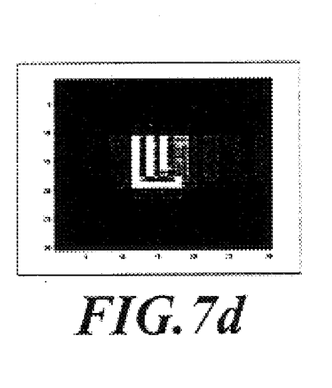
Figure 7E:
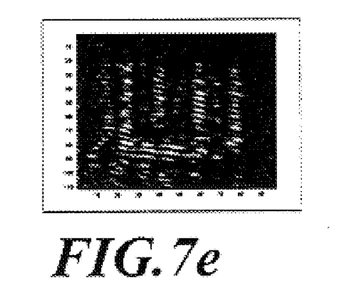
Figure 7F:
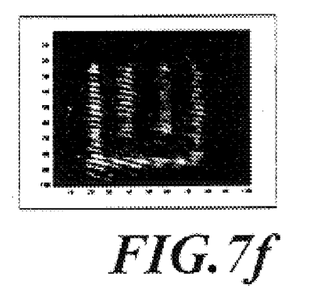

FIGS. 7a–7f present a comparison of the output images of a conventional Levenson-type phase mask (FIG. 7a) and a phase mask manufactured according to the present invention (FIG. 7b). The original amplitude mask is shown as in FIG. 3a. Phase mask in FIG. 7b is made from the Levenson mask in FIG. 7a by inserting an auxiliary phase region between the two phase-conflicting regions. FIG. 7c shows the simulated output field from the Levenson-type phase mask in FIG. 7a while the pattern in FIG. 7d is the simulated output field from the phase mask in FIG. 7b. FIGS. 7e and 7f show experimentally measured output images of the two phase masks, wherein the features in FIG. 7f are clearly resolved.

Figure 8A:
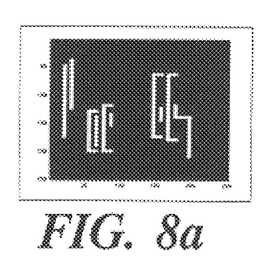
FIGS. 8a–8f show a comparison of output images of an amplitude mask, a Levenson-type phase mask and a phase mask in accordance with the present invention for negative photoresist by a simulation. The grey areas in FIGS. 8b–8c indicate phase areas that are π-phase shifted relative to the white areas.
Figure 8B:
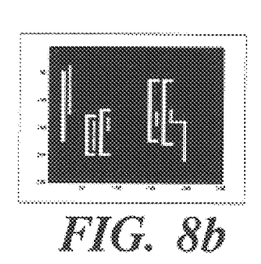
Figure 8C:
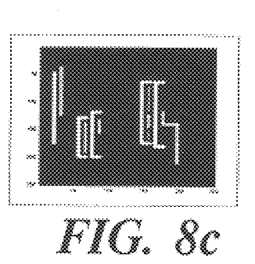
Figure 8D:
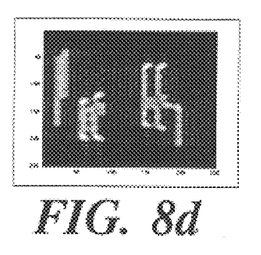
Figure 8E:
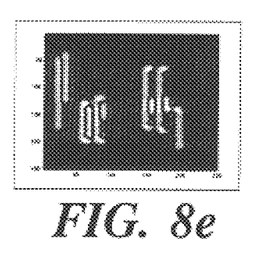
Figure 8F:
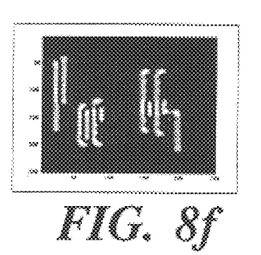

FIGS. 8a–8f are simulation results to further illustrate the performance of the phase masks made in accordance with the present invention. FIG. 8a is a pattern in a negative-photoresist amplitude mask. Imaging of the amplitude mask cannot resolve the features as shown in FIG. 8d. A Levenson-type phase mask shown in FIG. 8b has features with assigned opposite phase, i.e., the grey features have opposite phase relative to the white features. Phase conflict occurs in several adjacent features and causes degradation in the resolution (FIG. 8e). FIG. 8c shows a phase mask designed in accordance with the present invention and a well-resolved image as shown in FIG. 8f is achieved.

Figure 4A:
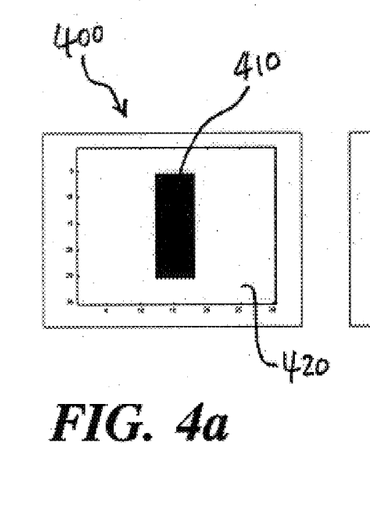
FIGS. 4a–4c illustrate effect of line formation in a transmissive-background mask imaged on a positive photoresist. The grey area in FIG. 4b indicates a π-phase shift relative to the white area in the background.
Figure 4B:
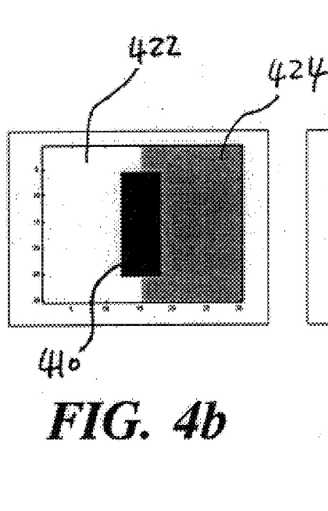
Figure 4C:
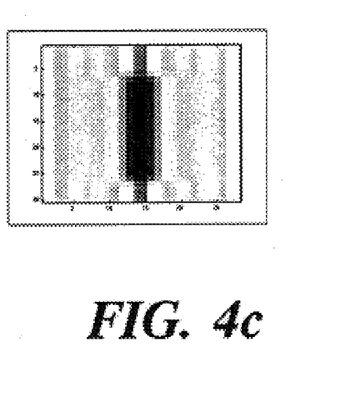
Figure 9A:
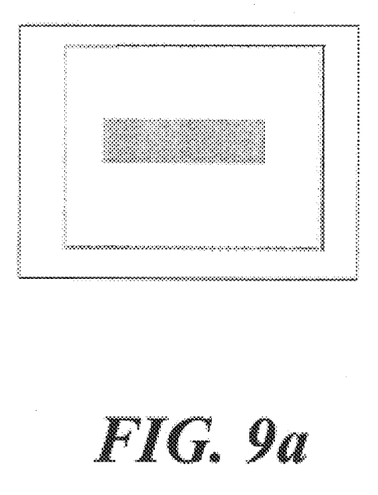
FIGS. 9a and 9b show a positive-photoresist phase mask in accordance with the present invention and the simulated output image thereof that is free of line formation.
Figure 9B:
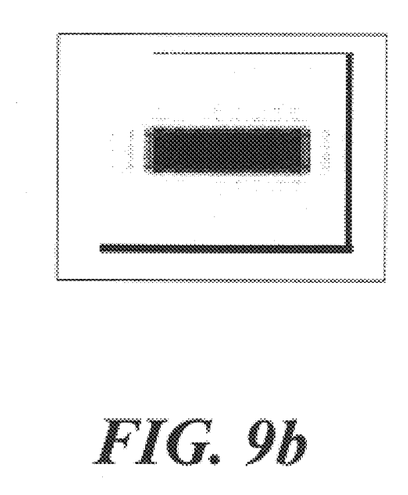

FIG. 9a shows a phase mask according to the present invention for the positive-photoresist amplitude mask shown in FIG. 4a. The feature in FIG. 9a is transmissive with an opposite phase to the phase of the background. FIG. 9b shows the simulated imaging result with the phase mask of FIG. 9a. The line formation shown in FIG. 4c caused by the conventional segmenting method for phase masks is substantially eliminated.

Figure 10D:
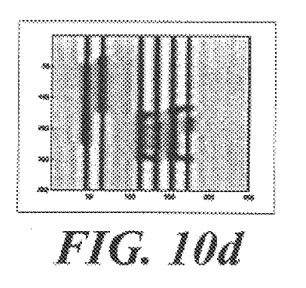
Figure 10E:
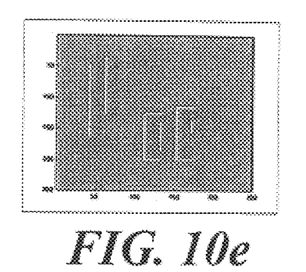
Figure 10F:
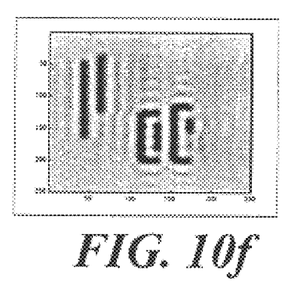

FIGS. 10a to 10f show another simulated example of making a phase mask of positive-photoresist in accordance with the present invention. An amplitude mask in FIG. 10a generates the image of FIG. 10b with unresolved features. Splitting the background into opposite phase regions as in the phase mask of FIG. 10c also produces poor imaging resolution due to the line formation as shown by FIG. 10d. Using a fully transmissive phase mask with features having opposite-phase to the background as in the phase mask of is FIG. 10e, all features are resolved. This is shown in FIG. 10f.

Figure 11A:
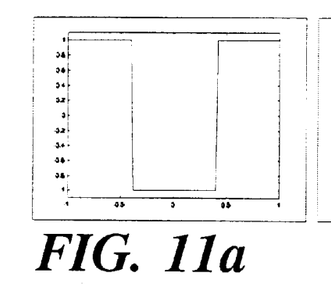
FIGS. 11a–11f show the effects of the segmenting technique in accordance with the present invention by a simulation for a positive photoresist phase mask.
Figure 11B:
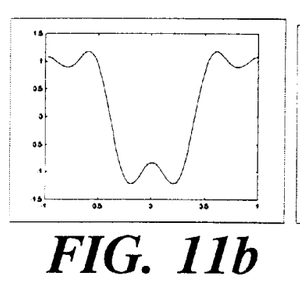
Figure 11C:
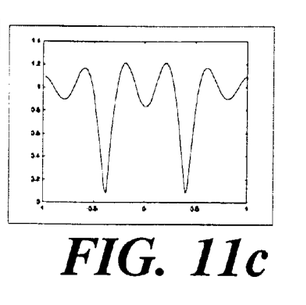
Figure 11D:
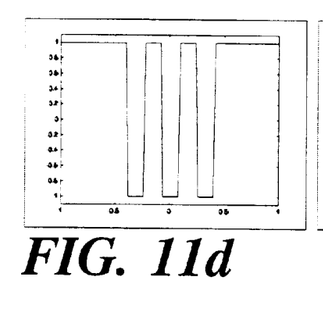
Figure 11E:
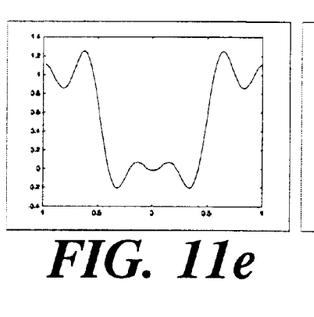
Figure 11F:
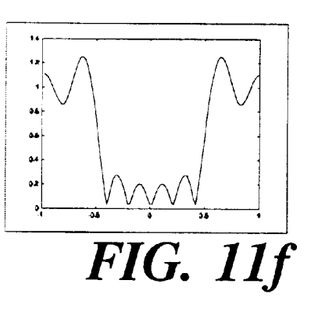

Effects of the segmenting technique of the present invention are illustrated by the example in FIGS. 11a to 11f for positive photoresist. A large opaque feature is made transmissive with opposite phase to the background (FIG. 11a) to produce a field of FIG. 11b after imaging. This results in an inadequate intensity pattern as shown by FIG. 11c. According to the present invention, the large opaque feature can be segmented into multiple π-shifted regions as shown by FIG. 11d. The corresponding field after imaging is shown in FIG. 11e, producing the desired intensity pattern of FIG. 11f.

This segmenting technique can be applied to negative-photoresist masks to split up large regions with phase conflict. This is to avoid large negative fields produced by inserting one large auxiliary phase-shifting region.

According to another aspect of the invention, attenuation may be adjusted to further improve the performance of a phase mask. Attenuation may be adjusted in conjunction with segmentation to avoid the large negative fields of large auxiliary phase regions, both in positive-photoresist (transmissive-background) masks and in negative-photoresist (opaque-background) masks. Attenuation can also be used as a substitute for the segmenting technique.

Figure 12A:
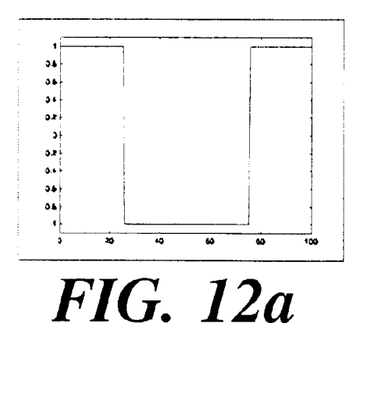
FIGS. 12a–12d show the effects of the attenuation technique in accordance with the present invention by simulation.
Figure 12B:
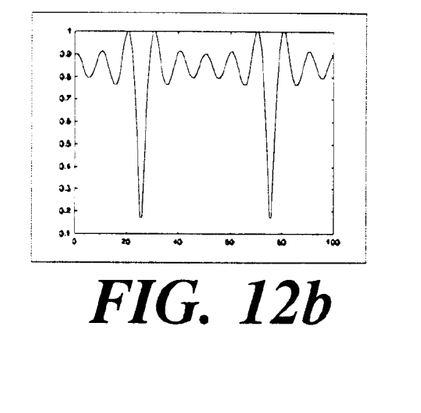
Figure 12C:
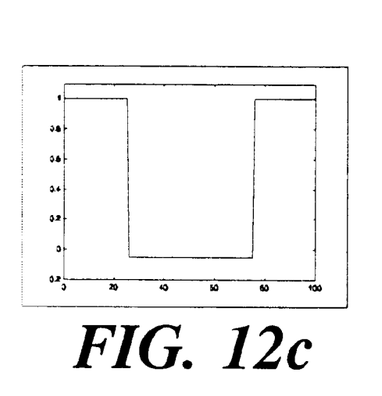
Figure 12D:
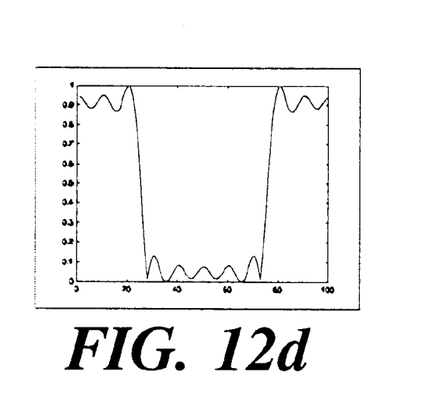

FIGS. 12a to 12d show the effect of attenuation in a phase-shift feature of a positive photoresist phase mask. FIGS. 12a and 12b show that a feature with full amplitude transmittance and a π phase shift (FIG. 12a) is unresolved after imaging (FIG. 12b). If the feature is made with a transmission of 5% in amplitude (an attenuation of 95%) and a π-phase shift (FIG. 12c), the feature becomes well resolved after imaging (FIG. 12d).

The preferred design rule for phase masks of the present invention can be combined with many different imaging calculation algorithms including the full Hopkins equations, modal expansions, optimal coherent approximations, and average coherence approximation. Furthermore, the preferred design rule can also be combined with other resolution- and focal depth-enhancement techniques, such as pupil filtering, off-axis illumination, and photoresist optimization. Significant performance improvement can be achieved by such combinations. For example, phase masks combined with off-axis illumination have shown improved contrast over off-axis illumination alone. Similarly, pupil filtering and phase masks together can achieve better depth of focus than phase masks alone, and highly nonlinear photoresists and contrast enhancement layers increase process latitude and the resolution improvement afforded by phase masks.

By producing phase assignments for large masks and solving phase conflicts, the preferred design methodology of the present invention allows the expansion of phase mask use to arbitrary layouts and processing layers (e.g., metallization or diffusion layers). This presents a significant advantage over conventional phase masks which are currently only being used for simple features like contact holes or spatially periodic patterns in many applications. The arbitrary-complexity positive-photoresist design rule by the present invention extends significantly the applicability of phase masks, since positive resists are far more common in the industry than negative resists.

Although the present invention has been described in detail with reference to a number of particular embodiments, one ordinarily skilled in the art to which this invention pertains will appreciate that various modifications and enhancements may be made without departing from the spirit and scope of the following claims.

What is claimed is:

1. A method for forming a phase mask to produce an imaged field pattern indicative of a desired pattern in a given imaging system, comprising:

forming an amplitude mask of a selected photoresist which has a plurality of transmissive and opaque features indicative of said desired pattern;

converting said amplitude mask into a phase mask by assigning each transmissive feature with a phase value according to a phase assigning criterion; and forming at least one auxiliary transmissive phase feature at a selected insertion location in said phase mask according to a phase insertion criterion, wherein said auxiliary transmissive phase feature does not constitute a feature of said desired pattern and is operable to reduce the difference between said imaged field of said phase mask and said desired pattern.

2. A method as in claim 1, wherein said phase assigning criterion and phase insertion criterion are determined by the Hopkins formula.

3. A method as in claim 1, wherein said selected photoresist is a negative photoresist in which said desired patterns are represented by transmissive features embedded in at least one opaque background feature; and the step of converting said amplitude mask comprises assigning two adjacent transmissive features with phase values that are shifted relative to each other by π.

4. A method as in claim 3, wherein said auxiliary phase feature is inserted in said opaque background feature between two transmissive features that are at least in part adjacent to each other when said two transmissive features are assigned with the same phase value according to said phase criterion, and said auxiliary phase feature is π-shifted with respect to said two transmissive features.

5. A method as in claim 4, further comprising making a first number of features in said phase mask have a first intensity attenuation and a second number of features have a second intensity attenuation that is different from said first intensity attenuation.

6. A method as in claim 1, wherein said selected photoresist is a positive photoresist in which said desired patterns are represented by opaque features embedded in at least one transmissive background feature in said amplitude mask; and the step of converting said amplitude mask comprises making said opaque features transmissive with a common phase value and assigning said transmissive background feature with a phase value that is π-phase shifted relative to said common phase value.

7. A method as in claim 6, wherein said auxiliary phase feature is inserted within one of said features to split said feature, said auxiliary phase feature having a phase value that is π-phase shifted relative to said feature.

8. A method as in claim 7, further comprising making a first number of features in said phase mask have a first intensity attenuation and a second number of features have a second intensity attenuation that is different from said first intensity attenuation.

9. A method as in claim 1, wherein said insertion location in said phase mask for forming said auxiliary phase feature is between two adjacent features.

10. A method as in claim 1, wherein said insertion location in said phase mask for forming said auxiliary phase feature is within a feature to split said feature.

11. A method as in claim 1, further comprising making at least two features in said phase mask have different intensity attenuation coefficients.

12. A method for forming a phase mask to produce a desired field pattern with an imaging system, comprising:

determining imaging parameters and mask parameters for said phase mask;

designing an amplitude mask which is configured to achieve said desired field pattern in said imaging system;

designing an initial phase mask based on said amplitude mask;

computing an actual field pattern produced by said initial phase mask in said imaging system using said imaging parameters;

comparing said actual field pattern with said desired field pattern to determine a field pattern difference therebetween;

determining location, phase value and geometry of at least one auxiliary phase region which does not constitute a feature of said desired pattern in said initial phase mask to substantially reduce said field pattern difference, wherein said auxiliary phase region has an opposite phase value with respect to adjacent features in said initial phase mask; and forming said phase mask by inserting said at least one auxiliary phase region into said initial phase mask.

13. A method as in claim 12, wherein said imaging parameters include aperture size, degree of coherence of illumination in the imaging system and demagnification factor, and said mask parameters for said phase mask include minimum mask feature size and photoresist type.

14. A method as in claim 12, wherein the step of computing said actual field pattern is based on the Hopkins formula.

15. A method as in claim 12, wherein the step of determining at least one auxiliary phase region is based on the Hopkins formula.

16. A method as in claim 12, wherein said phase mask is made of a negative photoresist in which said desired field pattern is represented by transmissive features embedded in at least one opaque background feature and the step of designing said initial phase mask comprises assigning two adjacent transmissive features with phase values that are shifted relative to each other by π.

17. A method as in claim 16, wherein said auxiliary phase feature is inserted in said opaque background feature between two transmissive features that are at least in part adjacent to each other when said two transmissive features are assigned with the same phase value, and said auxiliary phase feature is π-shifted with respect to said two transmissive features.

18. A method as in claim 17, further comprising making at least two features in said phase mask have different amounts of intensity attenuation.

19. A method as in claim 12, wherein said phase mask is made of a positive photoresist in which said desired patterns are represented by opaque features embedded in at least one transmissive background feature in said amplitude mask and the step of designing said initial phase mask comprises making said opaque features transmissive with a common phase value and assigning said transmissive background feature with a phase value that is π-phase shifted relative to said common phase value.

20. A method as in claim 19, wherein said auxiliary phase feature is inserted within one of said features to split said feature, said auxiliary phase feature having a phase value that is π-phase shifted relative to said feature.

21. A method as in claim 20, further comprising making at least two features in said phase mask have different amounts of intensity attenuation.

22. A phase mask of positive photoresist indicative of a pattern, comprising:

a plurality of transmissive features disposed relative to one another in said phase mask to indicate said pattern, said transmissive features having a common phase value relative to one another; and at least one transmissive background wherein said transmissive features are embedded, disposed in said phase mask and configured to have a phase value that is π-phase shifted relative to said common phase value of said transmissive features.

23. A phase mask as in claim 22, further comprising at least one auxiliary phase feature that does not constitute a feature in said pattern and is inserted within one of said transmissive features to split said feature, said auxiliary phase feature having a phase value that is π-phase shifted relative to said feature.

24. A phase mask as in claim 22, wherein at least one of said transmissive features has an intensity attenuation that is different from an intensity attenuation of said transmissive background.

25. A negative-photoresist phase mask indicative of a pattern, comprising:

an opaque background, disposed in said phase mask;

a first set of transmissive features disposed relative to one another and embedded in said opaque background, having a spatial relation that is at least in part indicative of said pattern, wherein any two of said plurality of transmissive features are spatially separated by a portion of said opaque background and each of said transmissive features is π-phase shifted relative to an adjacent transmissive feature;

a second set of transmissive features comprising a first transmissive feature and a second transmissive feature that are disposed adjacent to each other and separated by a portion of said opaque background, said first and second transmissive features having a common phase value, wherein said first and second sets of transmissive features in combination form a complete representation of said pattern in said opaque background; and at least one transmissive auxiliary phase feature which does not constitute a feature of said pattern and is inserted between said first and said second transmissive features, wherein said transmissive auxiliary phase feature has a phase value that is $\pi$-phase shifted relative to said common phase value of said first and second transmissive features and is operable to reduce constructive interference between said first and second transmissive features.

26. A phase mask as in claim 25, wherein a first group of said transmission features have a first intensity attenuation and a second group of said transmissive features have a second intensity attenuation that is different from said first intensity attenuation.

* * * * *